United States Patent [19]

Botti et al.

[11] Patent Number: 4,849,713

[45] Date of Patent: Jul. 18, 1989

[54] HIGH-DYNAMICS AMPLIFIER STAGE WITH DISTORTION DETECTION

[75] Inventors: Edoardo Botti, Mortara; Fabrizio Stefani, Cardano al Campo, both of Italy

[73] Assignee: SGS-Thomson Microelectronics S.p.a., Catania, Italy

[21] Appl. No.: 202,846

[22] Filed: Jun. 6, 1988

[30] Foreign Application Priority Data

Jun. 18, 1987 [IT] Italy ............................ 20950 A/87

[51] Int. Cl.⁴ ........................................ H03G 3/20
[52] U.S. Cl. ........................................ 330/284; 330/2; 330/144; 330/149
[58] Field of Search .................. 330/2, 144, 145, 149, 330/284

[56] References Cited

U.S. PATENT DOCUMENTS 4,048,573 5/1977 Evans et al. .................. 330/284 X Primary Examiner—James B. Mullins
Attorney, Agent, or Firm—Guido Modiano; Albert Josif

[57] ABSTRACT

In an amplifier stage comprising a pair of input current sources, connected in series between a pair of reference potential lines, a pair of output transistors connected between the pair of reference potential lines and defining an intermediate output terminal of the amplifier, a driving circuit comprising active elements and interposed between the input current source and the output transistors, and at least one saturation control circuit comprising at least one control transistor connected with its base to the driving circuit and with its collector and emitter between the output of the amplifier stage and the intermediate point between the input current sources, to detect distortion due to clipping, at least one distribution detection transistor is provided, connected to the control transistor so as to detect the current flowing through the latter, which current is related to the imbalance of the input current sources and therefore to the distortion generated in the stage.

9 Claims, 2 Drawing Sheets

HIGH-DYNAMICS AMPLIFIER STAGE WITH DISTORTION DETECTION

BACKGROUND OF THE INVENTION

The present invention relates to a high-dynamics amplifier stage with distortion detection, in particular a final amplifier stage with collector output and high dynamics.

In a low-frequency amplifier stage of the indicated type, shown by way of example and in simplified form in FIG. 1, the maximum output voltage is limited in theory by the supply voltage. Actually, in the best of hypotheses, the maximum excursion of the output voltage is equal to:

$$2 V_{CC} - V_{CEQ5,sat} - V_{CEQ6,sat}$$

When a low-frequency amplifier driving a loudspeaker with a for example musical signal reaches maximum excursion several times, it introduces a distortion due to clipping, so that the resulting sound becomes unpleasant.

A circuit can therefore be conceived which perceives this distortion condition, and sends this information, possibly filtered by means of an appropriate time constant such as to not introduce further distortions, to an attenuator circuit having the function of reducing the signal sent to the input of the amplifier so as to avoid, in stationary conditions, distortions of the output signal due to clipping higher than a given percentage.

For this purpose a circuit connected to the inputs of the amplifier stage has already been studied which can be schematically represented as an operational amplifier. In fact, as is known, in these types of amplifiers, during normal, linear operation, the voltage between the inputs is ideally nil, but becomes different from zero when the output is incapable of proportionally following the input, since the maximum possible output voltage has been reached (i.e. due to the occurrence of clipping). According to this known solution, therefore, the detector is connected to the inputs of the amplifier so as to detect any imbalances thereof indicative of the distortion. For this purpose, the known detector comprises at least two threshold amplifiers or comparators and an adder circuit.

Said known solution, though it indeed allows the detection of clipping, is however not free from disadvantages both due to the high circuital complexity and due to the interaction with the inputs which may be harmful in view, for example, of the decrease of the input impedance of the amplifier stage and of the increase of the input bias current.

SUMMARY OF THE INVENTION

Accordingly, the aim of the present invention is to provide a system for detecting the distortion due to clipping in a high-dynamics amplifier stage of the indicated type, capable of eliminating the disadvantages featured by the prior art.

Within this aim, a particular object of the present invention is to provide a simple distortion detection circuit, easily integratable with said amplifier stage and such as not to require a substantial increase in the complexity of said amplifier.

Still another object of the present invention is to provide a distortion detector which does not modify the electric characteristics of the associated amplifier stage, in particular as to the input impedance and the input bias current.

Still another object of the present invention is to provide a distortion detector in an amplifier stage of the indicated type, operating reliably and capable of always assuring detection of the presence of distortions.

Not least object of the present invention is to provide a distortion detector integratable in an amplifier stage of the indicated type so as not to entail an increase in costs in the production of the latter.

The indicated aim, the mentioned objects and others which will become apparent hereinafter are achieved by a high-dynamics amplifier stage with distortion detection, as defined in the accompanying claims.

BRIEF DESCRIPTION OF THE DRAWINGS

The characteristics and advantages of the invention will become apparent from the description of a preferred but not exclusive embodiment, illustrated only by way of nonlimitative example in the accompanying drawings, wherein.

DESCRIPTION OF THE PREFERRED EMBODIMENTS

Figure 1:
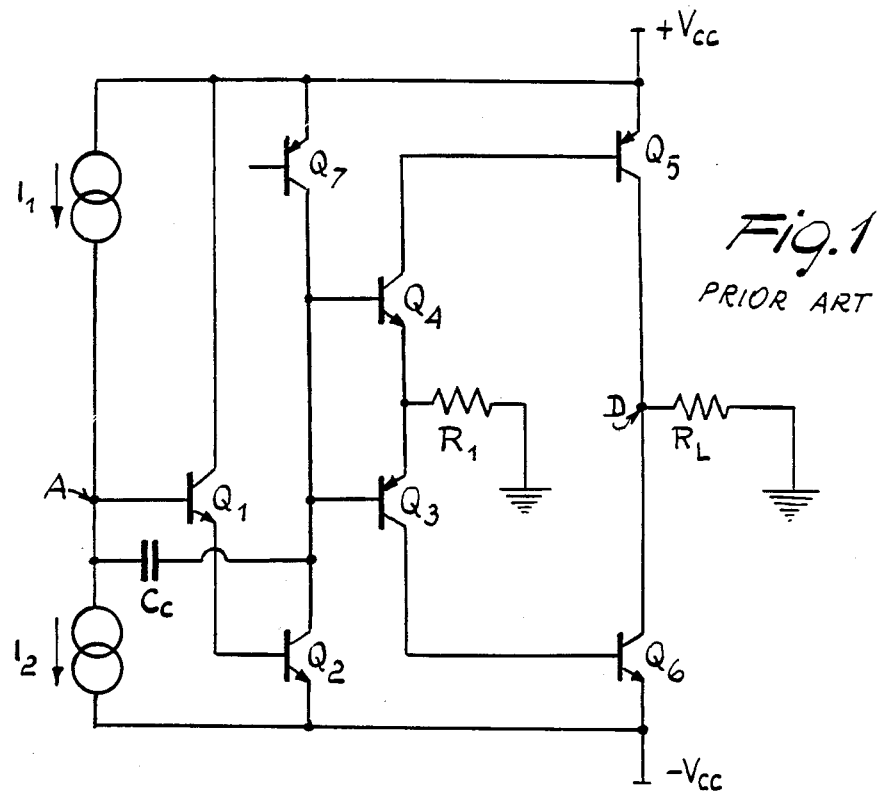
FIG. 1 is a simplified diagram of the final stage of a known amplifier

With reference to FIG. 1, a known low-frequency amplifier stage with low drop-out (i.e. high dynamics) comprises a pair of input current sources $I_1$, $I_2$, connected in series between a pair of reference potential lines $+V_{cc}$, $-V_{cc}$ and defining the input stage, generally formed by a voltage/current converter stage. The transistors $Q_1$–$Q_4$ and the constant current source $Q_7$, together with the resistor $R_1$, represent the driving circuit, while the transistors $Q_5$ and $Q_6$ form the two final transistors connected between the lines $+V_{cc}$, $-V_{cc}$ and defining therebetween, at point D, the output of the amplifier which is connected to a load $R_L$.

As mentioned, said known circuit has a maximum dynamics equal to:

$$2 V_{CC} - V_{CEQ5,sat} - V_{CEQ6,sat}$$

so that when the output signal reaches its maximum excursion the already described clipping occurs.

Figure 2:
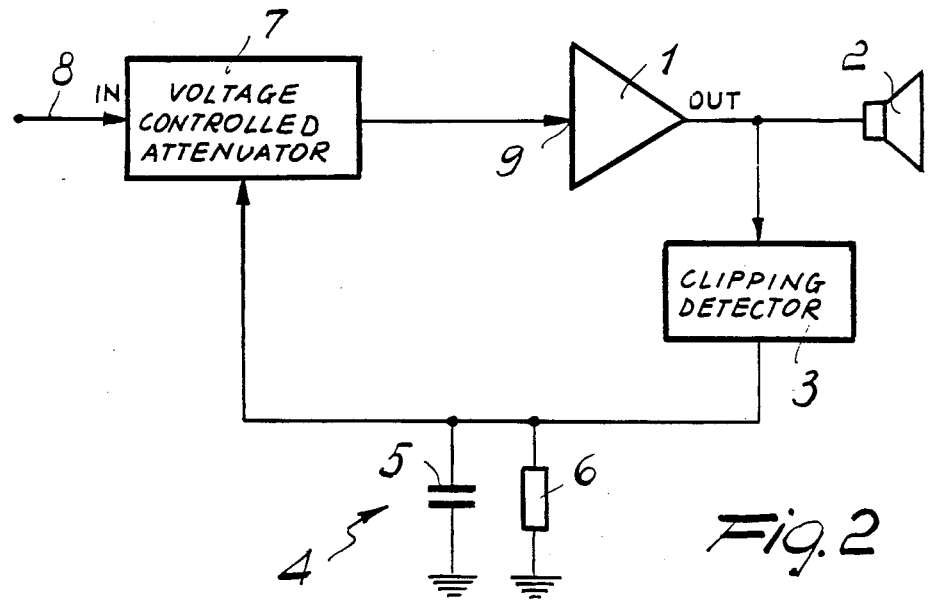
FIG. 2 is a simplified block diagram of the entire loop for the reduction of distortion due to clipping according to the invention.

According to the invention, to eliminate the distortion due to said clipping, the diagram of FIG. 2 is used, wherein 1 schematically indicates a final amplifier stage of the indicated type. As can be seen in the figure, the output of the amplifer 1, indicated at OUT and driving a loudspeaker 2, is sent to a clipping detection circuit 3 generating a signal proportional to the detected distortion. This clipping signal, through a suitable delay circuit 4, exemplified here by the capacitor 5 and by the resistor 6, is sent to a voltage-controlled attenuator 7 connected ahead of the amplifier 1 and precisely between the input 8 of the useful signal and the input 9 of the amplifier 1. Said attenuator 7, according to the distortion condition detected by the detector 3, reduces the signal sent at the input of the amplifier, thus reducing said distortion.

Figure 3:
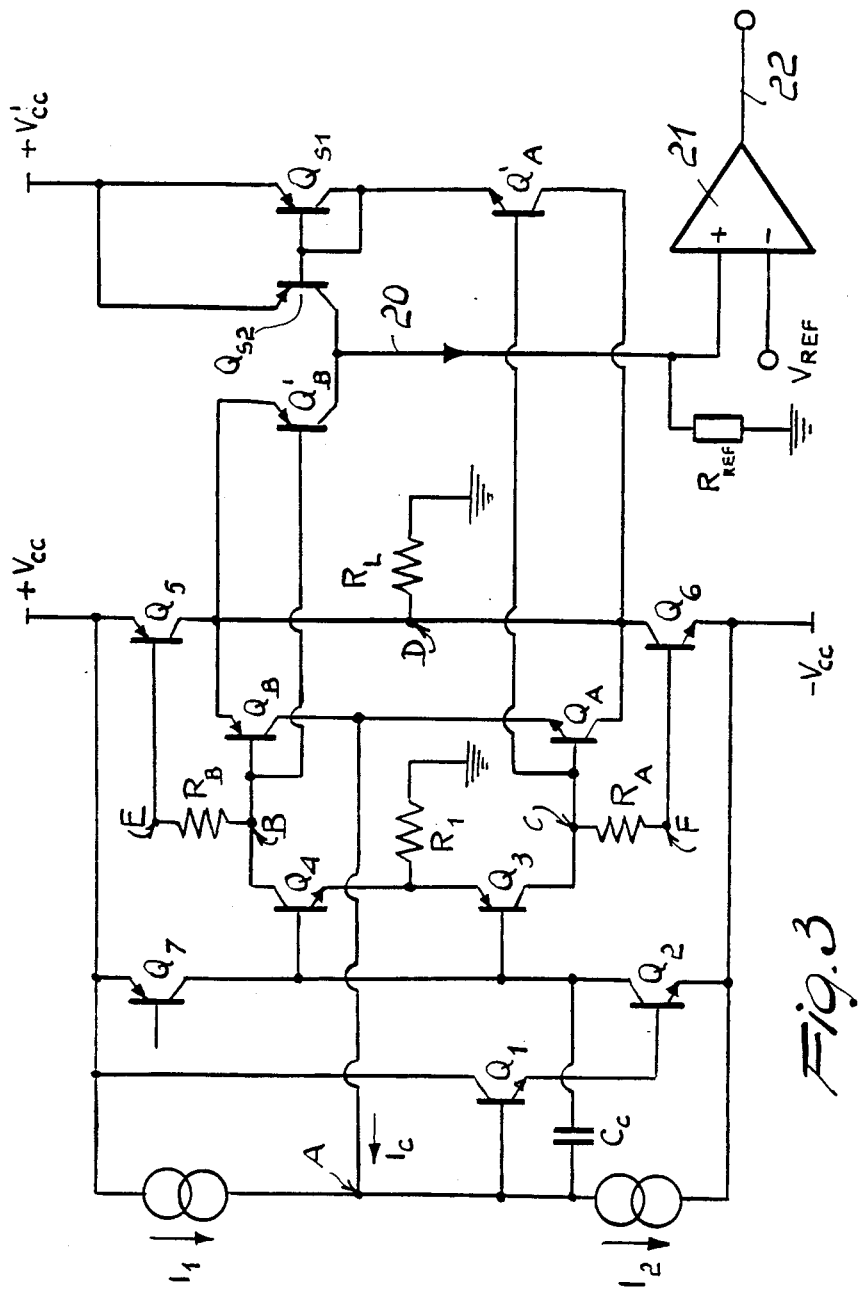
FIG. 3 is a simplified electric diagram of an amplifier stage according to the invention.

The distortion detector proposed with the present invention is shown in FIG. 3, illustrating a general circuit diagram of the amplifier stage complete with the detection circuit.

An amplifier circuit shown in FIG. 3 employs the solution object of the published Italian patent application No. 20 195 A/87 filed on Apr. 21, 1987 in the name of the same assignee and included herein as reference, capable of reducing the high saturation of output transistors.

As can be seen in FIG. 3, the shown amplifier stage still comprises two input current sources $I_1$ and $I_2$ and a driving part including transistors $Q_1$–$Q_4$ and $Q_7$ (forming a constant current source) for driving two output transistors $Q_5$ and $Q_6$ connected between the positive and negative power supply or reference potential lines $+V_{cc}$, $-V_{cc}$. The two output transistors are mutually connected with their collectors at point D which represents the output of the stage, for feeding the load, represented herein by the resistor $R_L$.

As in the abovementioned patent application, between the outputs of the driving stage, constituted by the collectors of the transistors $Q_4$ and $Q_3$ (points B and C), and the bases of the respective output transistors $Q_5$ and $Q_6$, saturation control circuits are connected, constituted by a respective resistor $R_B$ and $R_A$, connected each between a driving output and the respective output transistor, and by a transistor $Q_B$ and $Q_A$, having each its base connected to the respective driving output and connected with its emitter and collector terminals between the output D of the amplifier stage and the input A thereof, defined as intermediate point between the current sources $I_1$ and $I_2$.

According to the invention, this known circuit is connected a distortion detection circuit essentially comprising a pair of transistors $Q'_A$ and $Q'_B$ connected each to a transistor of the control circuit so as to be flown by the same current. In detail, the base of the transistor $Q'_A$ is connected to the base of the transistor $Q_A$, while its collector is connected to the collector of $Q_A$. Accordingly $Q'_A$ has a base-collector voltage equal to that of $Q_A$ and, since the latter is made to operate in its inverse linear region, $Q'_A$ also operates in its inverse linear region and supplies an emitter current, flowing from the emitter towards the collector, equal to the current flowing through $Q_A$.

Similarly, the transistor $Q'_B$ has its base connected to the base of $Q_B$ and its emitter connected to the emitter of $Q_B$. Accordingly the transistors $Q_B$ and $Q'_B$ operate with the same base-emitter voltage and therefore have an equal collector current.

In the example shown in FIG. 3, the clipping detector circuit, which in its basic structure essentially comprises only one of the transistors $Q'_A$, $Q'_B$, here also includes an adder circuit constituted by the transistors $Q_{S1}$ and $Q_{S2}$. In detail, the transistor $Q_{S1}$ is diode-connected in series between a further reference voltage line $V'_{cc}$ and $Q'_A$, so as to be flown by the same current as $Q'_A$, while the transistor $Q_{S2}$, forming a mirror with $Q_{S1}$, and therefore flown by the same current as the latter and thus as $Q'_A$, has its collector coupled to the collector of $Q'_B$, so that the current flowing in the line 20, connected to the collectors of $Q'_B$ and $Q_{S2}$, is the sum of the currents detected by $Q'_A$ and $Q'_B$. In the illustrated example, downstream of the adder circuit a threshold comparator is provided for supplying a control signal only when the distortion detected at the output of the amplifier stage exceeds a given value. For this purpose, the line 20 is connected to the positive input of a threshold amplifier or comparator 21 which receives on said input, by virtue of the resistor $R_{REF}$ (forming a current-voltage converter), a voltage proportional to the existing distortion. By applying a reference voltage $V_{REF}$ to the negative input of the comparator 21, the latter generates at the output a control signal indicative of minimal distortion, which signal can thus be fed to the attenuator 7, according to the diagram of FIG. 2, which correspondingly attenuates the signal fed at the input of the amplifier 1 by acting on the sources $I_1$ and $I_2$.

The operation of the amplifier with distortion detection circuit according to the invention is as follows.

As already indicated in the abovementioned patent application, initially supposing that the current delivered by the source $I_1$ is smaller than the current delivered by the source $I_2$ (i.e. that $I_1 < I_2$) the transistors $Q_1$, $Q_2$, $Q_3$, $Q_6$ are off, while the transistors $Q_4$ and $Q_5$ are on. Accordingly, the voltage of the output point D tends to rise to the positive supply voltage $V_{cc}$. Accordingly the voltage between the base and emitter of the transistor $Q_B$ also rises and, when it reaches the switch-on threshold thereof causes the switching on of $Q_B$ which thus conducts current between its emitter and its collector. This collector current of $Q_B$, fed to the input point A, feeds the base of $Q_1$, preventing its complete switching off. In practice, ignoring the base current of $Q_1$, the current through $Q_B$ is practically equal to the imbalance between $I_1$ and $I_2$, that is:

$$I_c \approx I_2 - I_1$$

If instead the current delivered by the source $I_1$ is greater than the current delivered by the source $I_2$, i.e. if $I_1 > I_2$, the excess current of the source $I_1$ tends to saturate the transistor $Q_2$ and the transistor $Q_6$, making the output D approach the negative power supply. Here, too, when the voltage difference between point C and point D reaches approximately 0.6 V, directly biasing the base-collector junction of the transistor $Q_A$, the same switches on with inverse bias, conducting current between its emitter and its collector. In this case, $I_c$ is given by:

$$I_c \approx I_1 - I_2$$

Consequently, due to the connection of the distortion detection transistors $Q'_A$ and $Q'_B$ to the related control transistors $Q_A$ and $Q_B$, these are selectively flown by a current proportional to the imbalance between the currents $I_1$ and $I_2$.

In a complete amplifier it can be shown that, within certain limits, and as in any case imaginable, this imbalance is a function of the percentage of distortion produced by the amplifier due in particular to the attainment of the maximum dynamics of the output signal (clipping). Consequently, the transistors $Q'_A$ and $Q'_B$ supply a current which is a function of the percentage of distortion and can thus be used for driving the attenuator 7 of FIG. 2.

In the illustrated case, in which the transistors $Q'_A$ and $Q'_B$ are connected by the adder circuit, a signal is obtained on the line 20 which is linked to the distortion alternately detected by $Q'_A$ or by $Q'_B$, since the output transistors $Q_5$ and $Q_6$ operate alternately. The distortion signal present on the line 20 is fed to the threshold comparator 21 which thus generates a driving signal on the output 22 only when the distortion has reached a preset minimum value, adjustable by means of the resistor $R_{REF}$ or of the reference voltage $V_{REF}$. This driving signal is then filtered by the circuit 4 and sent to the attenuator 7.

As can be seen from the above description, the invention fully achieves the proposed aim and objects. In fact, an amplifier stage has been provided comprising an extremely simple circuit for detecting the distortion due to clipping which, in some cases, may comprise even only one of the two detection transistors $Q'_A$ or $Q'_B$, which is easily integratable in the structure of the output amplifier without requiring high circuital complexities or greater bulk, and may be manufactured during the same process steps required for the production of the overall amplifier, so that the latter has overall costs equivalent to known amplifiers.

The indicated solution is also advantageous as to its reliability and also in view of the electric characteristics of the amplifier stage, which are practically not modified by the addition of the distortion detection circuit which operates on the final part of said stage, not altering its input characteristics.

The invention thus conceived is susceptible to numerous modifications and variations, all within the scope of the inventive concept. In particular, though a complete diagram with distortion detection on both output transistors and with further downstream circuits for the unification of the information and for comparison has been shown in FIG. 3, the fact is stressed that, when this is sufficient, it is possible to provide only one of the two distortion detection transistors and to directly control the attenuator according to the signal supplied by said transistor.

Even if it is preferred to provide both distortion detection circuits, the information supplied thereby may be used separately, without providing the above described unification circuit, or it is also possible to provide a circuit which unifies the information supplied by the two distortion detection circuits which operates differently from the one shown in FIG. 3.

The fact is furthermore stressed that the threshold comparator may even be omitted and that the obtained distortion signal may possibly undergo further processings, possibly required in particular cases.

Finally, all the details may be replaced with other technically equivalent ones.

We claim:

1. A high dynamics amplifier stage with distortion detection, comprising a pair of input current sources, connected in series between a pair of reference potential lines; a pair of output transistors, connected between said pair of reference potential lines and defining an output terminal of said amplifier stage; a driving circuit including active elements and interposed between said input current sources and said output transistors; at least one saturation control circuit including at least one control transistor connected with its base terminal to said driving circuit and with its collector and emitter terminals between one of said output transistors and the input current sources; at least one distortion detection transistor connected to said control transistor so as to supply a distortion detection current proportional to current flowing through said control transistor and correlated to distortion generated by said amplifier stage.

2. An amplifer stage according to claim 1, further comprising a controlled attentuator connected to said distortion detection transistor and receiving therefrom said distortion detection current, said controlled attenuator controlling said input current sources.

3. An amplifier stage according to claim 1, further comprising a delay circuit connected to said distortion detection transistor and receiving therefrom said distortion detection current, and a controlled attenuator having an input terminal connected to said delay circuit and an output terminal connected to said input current sources.

4. A high-dynamics amplifier stage with distortion detection, comprising a pair of input current sources, connected in series between a pair of reference potential lines; a pair of output transistors, connected between said pair of reference potential lines and defining therebetween an output terminal of said amplifier stage; a driving circuit including active elements and interposed between said input current sources and said output transistors; a pair of saturation control circuits respectively including at least a first and a second control transistors connected with their base terminals to said driving circuit, said first control transistor being connected with its emitter terminal to said output terminal and with its collector terminal to said input current sources, and said second control transistor being connected with its collector terminal to said output terminal and with its emitter terminal to said input current sources; a first distortion detection transistor connected with its own base terminal to said base terminal of said first control transistor and with its emitter terminal to said emitter terminal of said first control transistor, and a second distortion detection transistor connected with its own base terminal to said base terminal of said second control transistor, and with its own collector terminal to said collector terminal of said second control transistor, said first and second distortion detection transistors supplying distortion detection currents proportional to currents flowing respectively through said first and second control transistors and correlated to distortion generated by said stage.

5. An amplifier stage according to claim 4, further comprising a controlled attenuator connected to said distortion detection transistors and receiving said distortion currents, said controlled attenuator controlling said input current sources.

6. An amplifier stage according to claim 4, further comprising a delay circuit connected to said distortion detection transistors and receiving therefrom said distortion currents, and a controlled attenuator having an input terminal connected to said delay circuit and an output terminal connected to said input current sources.

7. An amplifier stage according to claim 4, further comprising an adder circuit having a first input connected to a collector terminal of said first distortion detection transistor and a second input connected to an emitter terminal of said second distortion detection transistor, said adder circuit having an output terminal feeding a current signal equal to the sum of said currents flowing through said distortion detection transistors.

8. An amplifier stage according to claim 7, wherein said adder circuit comprises a current mirror circuit including a first and second adder transistors, said first adder transistor having its own collector terminal connected to said emitter terminal of said second distortion detection transistor, to its own base terminal and to a base terminal of said second adder transistor, said adder transistors having mutually connected emitter terminals and said second adder transistor having its own collector terminal connected to said collector terminal of said first distortion detection transistor and forming said output terminal of said adder circuit.

9. An amplifier stage according to claim 7, wherein said output terminal of said adder circuit is connected, through a current-voltage converter generating a distortion voltage signal, to a first input of a comparator circuit having a second input connected to a threshold reference voltage, said comparator circuit generating a control signal when said distortion voltage signal exceeds said threshold reference voltage.

* * * * *